(12) United States Patent
Xu et al.

(10) Patent No.: US 11,651,726 B2
(45) Date of Patent: May 16, 2023

(54) DISPLAY PANEL AND DISPLAY DEVICE

(71) Applicant: Xiamen Tianma Display Technology Co., Ltd., Xiamen (CN)

(72) Inventors: Yuping Xu, Xiamen (CN); Jieliang Li, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 17/456,789

(22) Filed: Nov. 29, 2021

(65) Prior Publication Data

US 2023/0070413 A1 Mar. 9, 2023

(30) Foreign Application Priority Data

Sep. 7, 2021 (CN) .......................... 202111045926.9

(51) Int. Cl.
*G09G 3/32* (2016.01)
*H01L 27/12* (2006.01)
*H01L 29/786* (2006.01)

(52) U.S. Cl.
CPC ............ *G09G 3/32* (2013.01); *H01L 27/124* (2013.01); *H01L 27/1225* (2013.01); *H01L 27/1251* (2013.01); *H01L 27/1255* (2013.01); *H01L 29/7869* (2013.01); *H01L 29/78675* (2013.01); *G09G 2300/0465* (2013.01); *G09G 2300/0842* (2013.01); *G09G 2310/061* (2013.01)

(58) Field of Classification Search
CPC ............ G09G 3/32; G09G 2300/0465; G09G 2300/0842; G09G 2310/061; H01L 27/1225; H01L 27/124; H01L 27/1251; H01L 27/1255; H01L 29/78675; H01L 29/7869
See application file for complete search history.

(56) References Cited

U.S. PATENT DOCUMENTS

2021/0066424 A1* 3/2021 Han .................... H01L 51/0094

* cited by examiner

*Primary Examiner* — Robert J Michaud
(74) *Attorney, Agent, or Firm* — Anova Law Group PLLC

(57) ABSTRACT

A display panel and a display device are provided. The display panel includes: a pixel circuit including a driving transistor, a first transistor, and a second transistor; a light-emitting element; a first signal line connected to a gate of the first transistor; a second signal line connected to a gate of the second transistor; and a first capacitor. A source or drain of the first transistor is connected to a gate of the driving transistor; and a source or drain of the second transistor is connected to a source or drain of the driving transistor. When being projected on a surface of the display panel, the second signal line is located between the gate of the driving transistor and the first signal line, or the first signal line and the second signal line are located at two sides of the gate of the driving transistor respectively.

19 Claims, 12 Drawing Sheets

DISPLAY PANEL AND DISPLAY DEVICE

CROSS-REFERENCE TO RELATED APPLICATION

This application claims the priority of Chinese Patent Application No. 202111045926.9, filed on Sep. 7, 2021, the content of which is incorporated herein by reference in its entirety.

TECHNICAL FIELD

The present disclosure generally relates to the field of electronic devices and, more particularly, relates to a display panel and a display device.

BACKGROUND

As science and technologies continuously develop, more and more display devices, including mobile phones, tablet computers, notebook computers, or smart wearable devices, are widely used in people's daily life and work. It has brought great convenience and has become an indispensable and important tool for people today. A main component of a display device to realize a display function is a display panel.

In the display device, when a pixel circuit drives a light-emitting element to perform image display, the pixel circuit has a problem of unstable node voltage, which affects the image display quality.

SUMMARY

One aspect of the present disclosure provides a display panel. The display panel includes a pixel circuit, a light-emitting element, a first signal line, a second signal line, and a first capacitor. The pixel circuit includes a driving transistor for providing a driving current to the light-emitting element, a first transistor, and a second transistor. A source or drain of the first transistor is connected to a gate of the driving transistor; and a source or drain of the second transistor is connected to a source or drain of the driving transistor. The first signal line is connected to a gate of the first transistor for providing a control signal for the first transistor; and the second signal line connected to a gate of the second transistor for providing a control signal for the second transistor. The first capacitor includes a first electrode plate connected to the gate of the driving transistor and a second electrode plate connected to the second signal line. When being orthographically projected on a plane parallel to a surface of the display panel, the second signal line is located between the gate of the driving transistor and the first signal line, or the first signal line and the second signal line are located at two sides of the gate of the driving transistor respectively.

Another aspect of the present disclosure provides a display device. The display device includes a display panel. The display panel includes a pixel circuit, a light-emitting element, a first signal line, a second signal line, and a first capacitor. The pixel circuit includes a driving transistor for providing a driving current to the light-emitting element, a first transistor, and a second transistor. A source or drain of the first transistor is connected to a gate of the driving transistor; and a source or drain of the second transistor is connected to a source or drain of the driving transistor. The first signal line is connected to a gate of the first transistor for providing a control signal for the first transistor; and the second signal line connected to a gate of the second transistor for providing a control signal for the second transistor. The first capacitor includes a first electrode plate connected to the gate of the driving transistor and a second electrode plate connected to the second signal line. When being orthographically projected on a plane parallel to a surface of the display panel, the second signal line is located between the gate of the driving transistor and the first signal line, or the first signal line and the second signal line are located at two sides of the gate of the driving transistor respectively.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
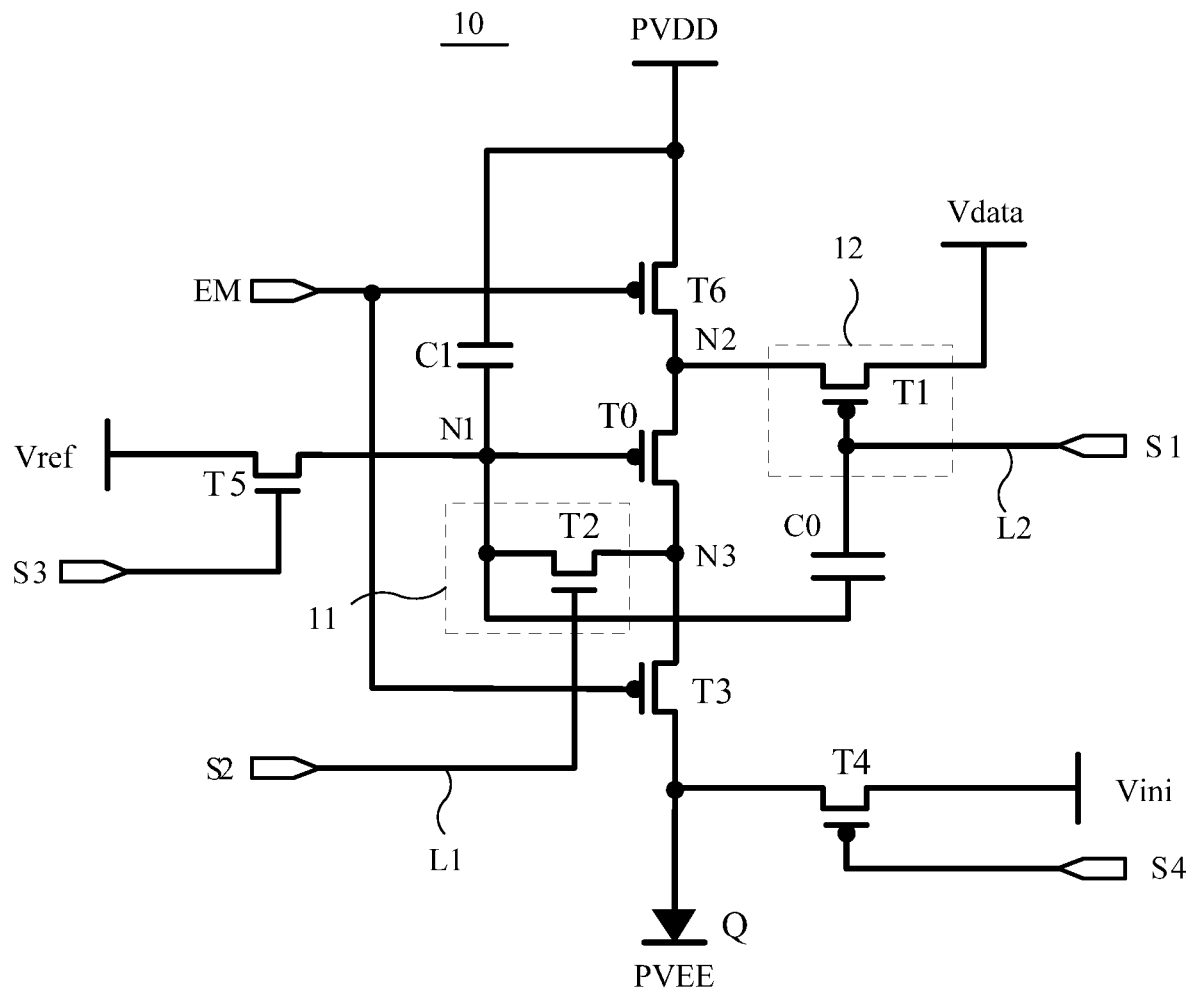
FIG. 1 illustrates a circuit structure of a pixel circuit in an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In existing display devices, when a pixel circuit drives a light-emitting element to perform image display, the pixel circuit has a problem of unstable node voltage, which affects the image display quality.

The present disclosure provides a display panel, to at least partially alleviate above problems. The display panel may include a pixel circuit, a light-emitting element, a first signal line, a second signal line, and a first capacitor.

The pixel circuit may include a driving transistor, a first transistor and a second transistor. The driving transistor may be configured to provide driving current to the light-emitting element. A source or drain of the first transistor may be connected to a gate of the driving transistor, and a source or drain of the second transistor may be connected to a source or drain of the driving transistor.

The first signal line may be connected to a gate of the first transistor, for providing control signal to the first transistor.

The second signal line may be connected to a gate of the second transistor, for providing control signal to the second transistor.

The first capacitor may include a first electrode plate and a second electrode plate. The first electrode plate may be connected to the gate of the driving transistor and the second electrode plate may be connected to the second signal line.

When being orthographically project on a plane of a surface of the display panel, the second signal line may be located between the gate of the driving transistor and the first signal line, or the first signal line and the second signal line may be located at two sides of the gate of the driving transistor respectively.

In the present disclosure, the first capacitor may be disposed in the pixel circuit. The first electrode plate may be connected to the gate of the driving transistor and the second electrode plate may be connected to the second signal line. The electrical potential of the gate of the driving transistor may be adjusted through the first capacitor. Correspondingly, instability of the node voltage in the pixel circuit may be alleviated to improve the display quality.

Figure 2:
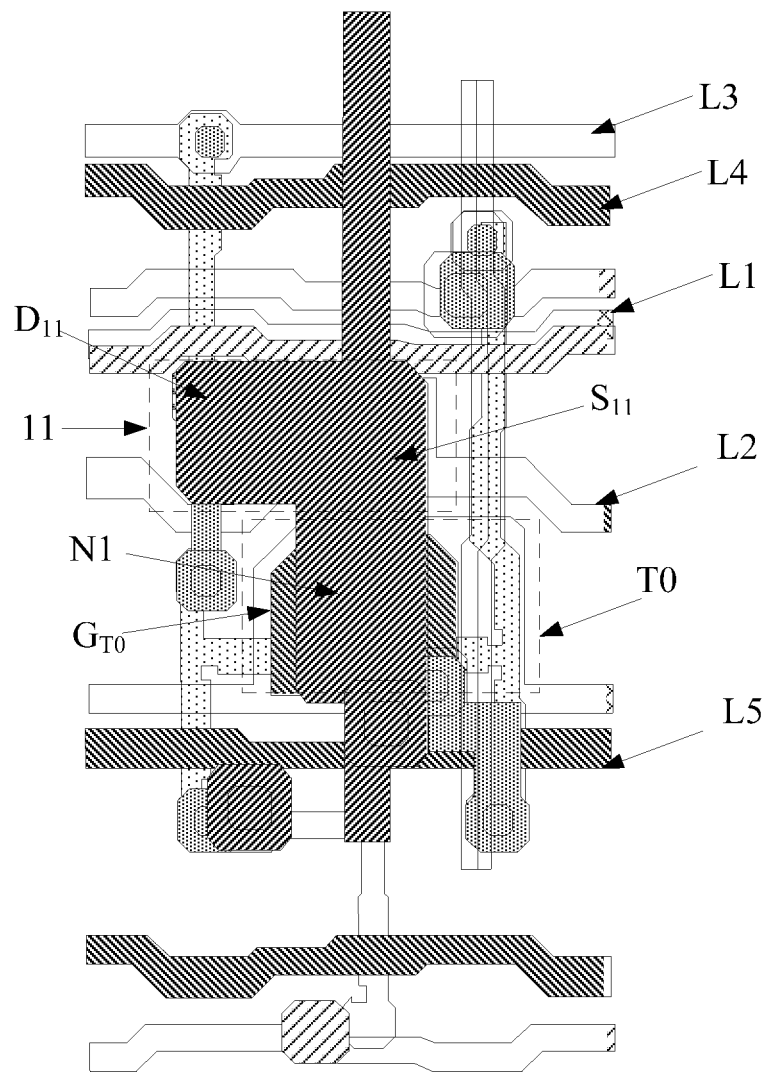
FIG. 2 illustrates a circuit layout of an exemplary display panel consistent with various disclosed embodiments in the present disclosure.
Figure 3:
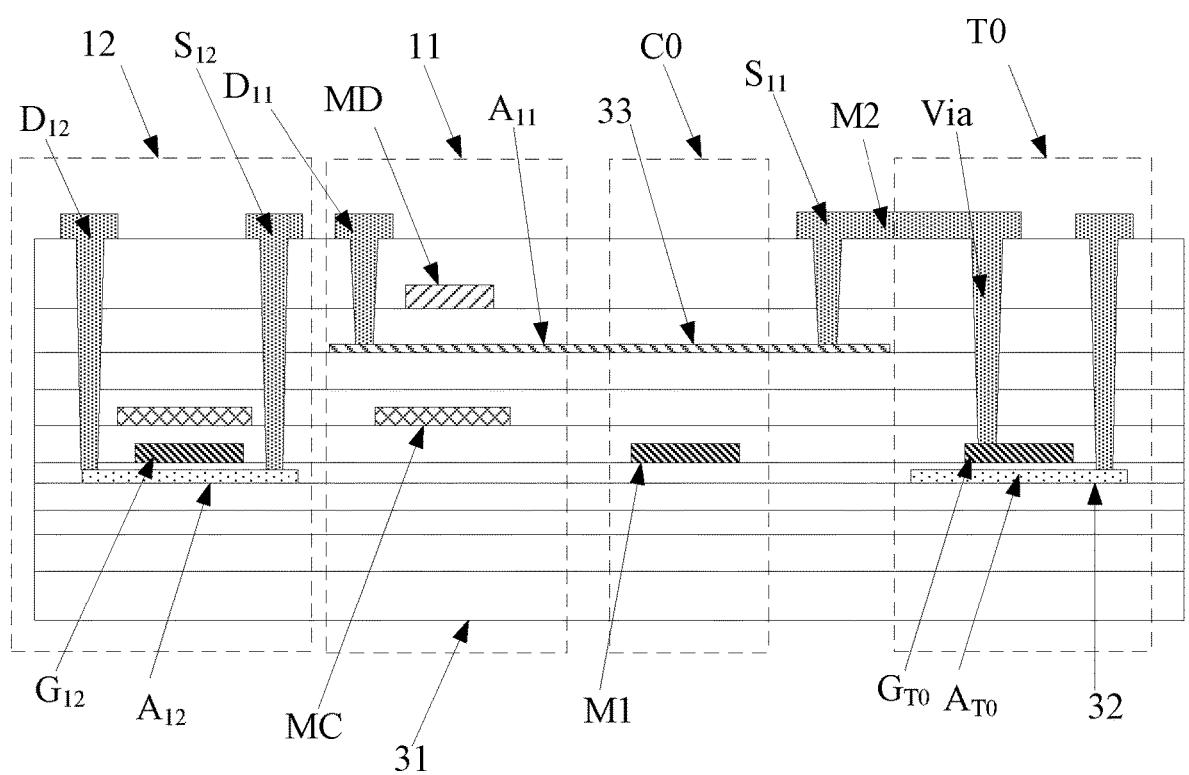
FIG. 3 illustrates a sectional view of an exemplary display panel consistent with various disclosed embodiments in the present disclosure.

One embodiment of the present disclosure provides a display panel shown in FIG. 1 to FIG. 3. FIG. 1 shows a circuit structure of the pixel circuit in the display panel provided by the present embidiment. FIG. 2 shows a circuit layout of the display panel provided by the present embidiment. FIG. 3 shows a sectional view of the display panel provided by the present embidiment. As shown in FIG. 1 to FIG. 3, in the present embodiment, the display panel may include a pixel circuit 10, a light-emitting element Q, a first signal line L1, a second signal line L2, and a first capacitor C0.

The pixel circuit 10 may include a driving transistor T0, a first transistor 11 and a second transistor 12. The driving transistor T0 may be configured to provide driving current to the light-emitting element Q. A source or drain of the first transistor 11 may be connected to a gate $G_{T0}$ of the driving transistor T0, and a source or drain of the second transistor 12 may be connected to a source or drain of the driving transistor T0.

The first signal line L1 may be connected to a gate of the first transistor 11, for providing control signal to the first transistor 11.

The second signal line L2 may be connected to a gate of the second transistor 12, for providing control signal to the second transistor 12.

The first capacitor C0 may include a first electrode plate and a second electrode plate. The first electrode plate may be connected to the gate $G_{T0}$ of the driving transistor T0 and the second electrode plate may be connected to the second signal line L2.

When being orthographically project on a plane of a surface of the display panel, the second signal line L2 may be located between the gate $G_{T0}$ of the driving transistor T0 and the first signal line L1. The gate $G_{T0}$ of the driving transistor T0 may be connected to a first node N1. In the present embodiment, a distance between the second signal line L2 and the first node N1 may be small.

It should be noted that, in this embodiment, to better illustrate the projection relationship of each structure on the plane, the relationship between each structure on the plane is explained by the orthographic projection to a plane parallel to the surface of the display panel. It can also be considered as a vertical projection, that is, each structure that is not originally located on the same film layer is projected vertically onto the same plane, and then the relationship between the structures is explained.

The display panel may include a first metal layer M1, a second metal layer M2, and a third metal layer. The display panel may include a substrate 31, and the first metal layer M1, the second metal layer M2 and the third metal layer may be located at the same side of the substrate 31. The third metal layer may be located between the first metal layer M1 and the second metal layer M2. The second transistor 12 includes a gate $G_{12}$, an active layer $A_{12}$, a source $S_{12}$ and a drain $D_{12}$. The gate $G_{12}$ may be located in the first metal layer M1, and the source $S_{12}$ and/or drain $D_{12}$ may be located in the second metal layer M2. The active layer $A_{12}$ may a material including silicon. The first transistor 11 may include a gate, an active layer $A_{11}$, a source $S_{11}$ and a drain $D_{11}$. The gate may be located in the third metal layer, and the source $S_{11}$ and/or the drain $D_{11}$ may be located in the second metal layer M2. The active layer Au may be made of a material including an oxide semiconductor. The first signal line L1 may be located in the third metal layer, and the second signal line L2 may be located in the first metal layer M1.

Specifically, a first active layer 32 may be disposed at the substrate 31. The first active layer 32 may include an active layer $A_{T0}$ of the driving transistor T0 and the active laye $A_{12}$ of the second transistor 12. The first metal layer M1 may be disposed at a side of the first active layer 32 away from the substrate 31. The first metal layer 31 may include the gate $G_{T0}$ of the driving transistor T0 and the gate $G_{12}$ of the second transistor 12. Both the driving transistor T0 and the second transistor 12 may have a top gate structure. A second active layer 33 may be disposed at a side of the first metal layer M1 away from the first active layer 32. The second active layer 33 may include the active layer A11 of the first transistor 11. The second metal layer M2 may be disposed at a side of the second active layer 33 away from the first metal layer M1. Optionally, the second metal layer M2 may include a source and a drain of each transistor. The first transistor 11 may be a dual gate transistor including a top gate MD and a bottom gate MC. The bottom gate MC may be located between the first metal layer M1 and the second active layer 33. The top gate MD may be located between the second metal layer M2 and the second active layer 33. The third metal layer may be a metal layer where the top gate MD is located or a metal layer where the bottom gate MC is located.

In the present embodiment, the first metal layer M1 and the second active layer 33 may be multiplexed to form the first capacitor C0. Correspondingly, existing conductive layers in the display panel may be used to form the first capacitor C0, and there may be no need to increase the layer structure. The thickness of the display panel may not be increased then.

The first node N1 may need to form the first capacitor C0 with the second signal line L2, and the first node N1 may be the source of the first transistor 11. The first signal line L1 may form the gate of the first transistor 11. When the first signal line L1 is located between the driving transistor T0 and the second signal line L2, the first signal line L1 may be connected to the first node N1 after forming a channel region with the active layer; and the second signal line L2 may further need to form an overlap with the first node N1. Correspondingly, the second signal line L2 may need to cross a relatively long region to overlap the first node N1, or the first node N1 may need to cross a relatively long region to overlap the second signal line L2. On the one hand, this may cause the first capacitor C0 and the channel region of the first transistor 11 to overlap each other, resulting in a larger parasitic capacitance. On the other hand, this may cause the pixel circuit to occupy a larger region and affect the resolution (PPI) of the display panel.

When the first signal line L1 and the second signal line L2 are both located on the same side of the driving transistor T0, the second signal line L2 may need to be close to the gate $G_{T0}$ of the driving transistor T0, and the first signal line L1 may need to be away from the gate $G_{T0}$ of the driving transistor T0. Correspondingly, the second signal line L2 may be closer to the gate $G_{T0}$ of the driving transistor T0 than the first signal line L1. In the embodiment of the present disclosure, the second signal line L2 may be disposed between the gate $G_{T0}$ of the driving transistor T0 and the first signal line L1, such that the distance between the second signal line L2 and the first node N1 can be smaller. Correspondingly, it may be easy to set up the first capacitor C0, avoiding the parasitic capacitance problem caused by the first capacitor C0. The resolution (PPI) of the display panel may not be affected.

In some other embodiments, the first signal line L1 and the second signal line L2 may be located at two sides of the gate $G_{T0}$ of the driving transistor T0, respectively. Compared with the embodiment where the second signal line L2 is located between the driving transistor T0 and the first signal line L1, by disposing the first signal line L1 and the second signal line L2 at two sides of the driving transistor T0 respectively, the distance between the second signal line L2 and the first node N1 may also be reduced, and problems induced by arranging the first signal line L1 and the second signal line L2 at the same side of the driving transistor T0 and that the first signal line L1 is too close to the first node N1.

In the embodiment shown in FIG. 1, based on a 7T1C pixel circuit, the first capacitor C0 may be added. The pixel circuit may include the driving transistor T0, the first transistor 11 and the second transistor 12. The pixel circuit may further include a transistor T3, a transistor T4, a transistor T5, a transistor T6, and a storage capacitor C1.

The gate $G_{T0}$ of the driving transistor T0 may be connected to the first node N1. One of the source and drain of the driving transistor T0 may be connected to a second node N2, and another may be connected to a third node N3. In the second transistor 12, the gate $G_{12}$ may be connected to the second signal line L2 for inputting the first control signal S1, one of the source and drain may be connected to the second node N2, and another may be connected to a data signal terminal for input data signal Vdata. In the first transistor 11, the gate may be connected to the first signal line L1 for inputting control signal S2, one of the source and drain may be connected to the first node N1, and another may be connected to the third node N3. In the transistor T3, a gate may be used to input control signal EM, one of the source and drain may be connected to the third node N3, and another may be connected to an anode of the light-emitting element Q. A cathode of the light-emitting element Q may be used to input low-level voltage PVEE. In the transistor T4, a gate may receive control signal S4, one of a source and drain may be connected to the anode of the light-emitting element Q, and another may receive signal Vini. In the transistor T5, a gate may be used to input the control signal S3, one of a source and the drain may be connected to the first node, and another may be used to input reference voltage Vref. In the transistor T6, a gate may be used to input the control signal EM, one of the source and the drain may be connected to the second node N2, and another may be used to input the high level voltage PVDD. One electrode plate of the storage capacitor C1 may be used to input the high level voltage PVDD, and another electrode plate may be connected to the first node N1.

Figure 4:
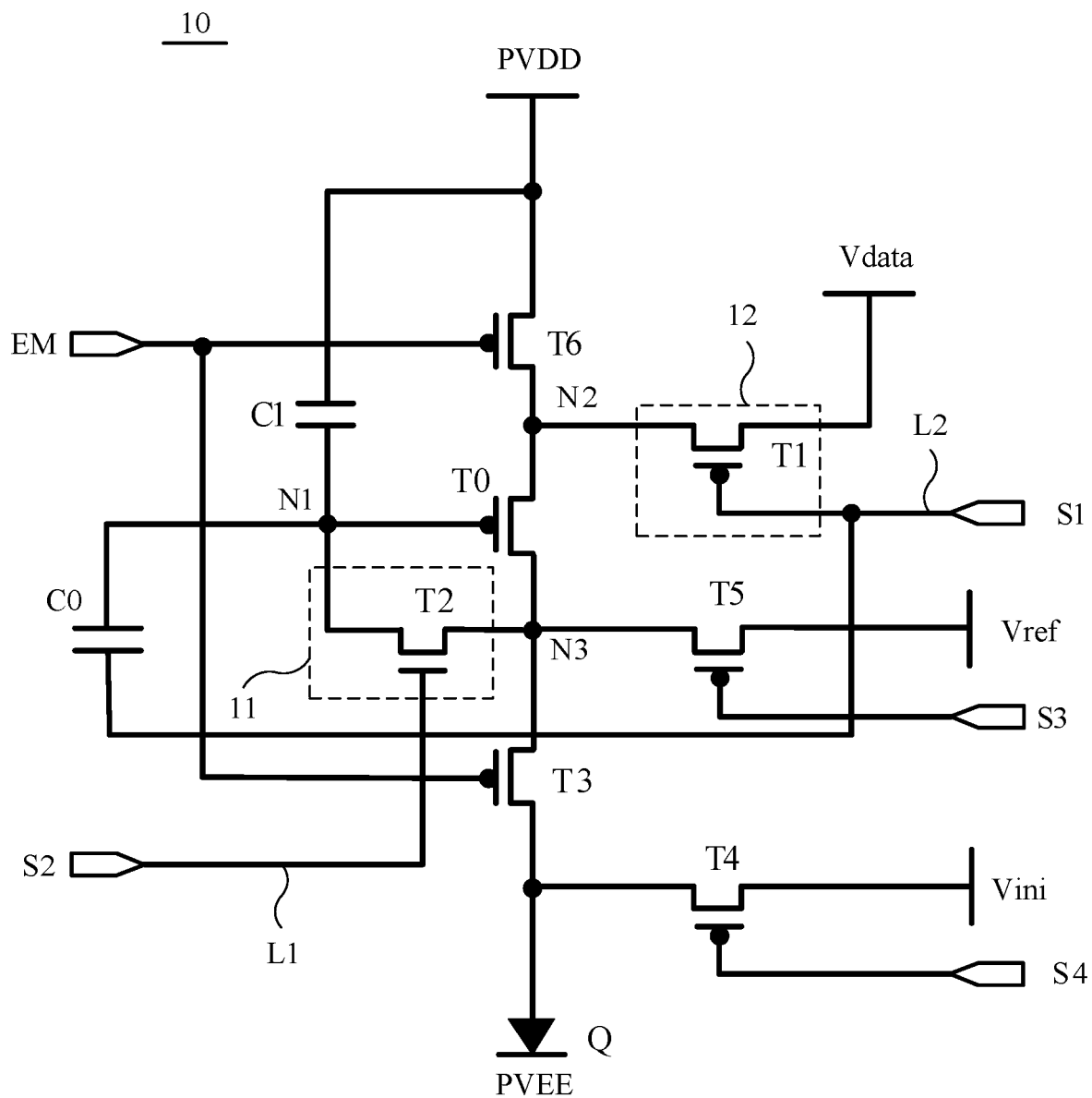
FIG. 4 illustrates another circuit structure of a pixel circuit in an exemplary display panel consistent with various disclosed embodiments in the present disclosure.

In another embodiment illustrated in FIG. 4 showing the circuit structure of another pixel circuit, one of the source or drain of the transistor T5 may be connected to the third node N3, and another may be used to input the reference voltage Vref, which is different from FIG. 1.

The first transistor 11 may be used as a compensation transistor. Taking the driving transistor T0 as a PMOS transistor as an example, during the data writing phase of the pixel circuit, the data signal Vdata may be written to the gate $G_{T0}$ of the driving transistor T0 by turning on the first transistor 11 and the second transistor 12. After the data writing phase is over, the first transistor 11 and the second transistor 12 may be turned off. The second transistor 12 may be a PMOS transistor. When the second transistor 12 is turned off, the control signal S1 on the second signal line L2 may be raised from a low-level signal to a high-level signal.

When the compensation transistor is turned off, the voltage of the gate $G_{T0}$ of the driving transistor T0 may be affected, and its potential may have a certain downward trend. that is, the potential may be pulled down. Then the potential of the first node N1 may be pulled down. In this case, to keep the driving transistor T0 off in a dark state, a higher dark state data voltage is required, resulting in larger power consumption. To solve this problem, in the present disclosure, the first capacitor C0 may be added to the pixel circuit. When the compensation transistor is turned off, the first capacitor C0 may be charged by the control signal S1 input from the gate $G_{12}$ of the second transistor 12, since the control signal S1 may rise from a low-level signal to a high-level signal. Correspondingly, the first capacitor C0 could be used to raise the potential of the first node N1, to offset the aforementioned downward trend of the potential of the first node N1 caused by the turning off of the compensation transistor. The potential of the gate $G_{T0}$ of the driving transistor T0 may be kept stable.

In the present embodiment, the first transistor 11 may be an NMOS transistor, and the active layer Au of the first transistor 11 may be made of a material including an oxide semiconductor. Optionally, the second active layer may be made of a material including Indium Gallium Zinc Oxide (IGZ). The second transistor 12 may be a PMOS type transistor, and the active layer $A_{12}$ of the second transistor 12 may be made of a material including silicon. Optionally, the first active layer 32 may be made of a material including polysilicon. An NMOS transistor may be used as the first transistor 11, which has a small leakage current. The first transistor 11 may be connected to the gate $G_{T0}$ of the driving transistor T0, ensuring the stability of the gate potential of the driving transistor T0.

As shown in FIG. 1 and FIG. 4, the pixel circuit may include a compensation transistor T2. The compensation transistor T2 may be connected between the gate Gm of the driving transistor T0 and the drain of the driving transistor T0. The first transistor 11 may be used as the compensation transistor T2. In the present embodiment, the first transistor 11 may be used to perform threshold compensation on the driving transistor T0.

Figure 5:
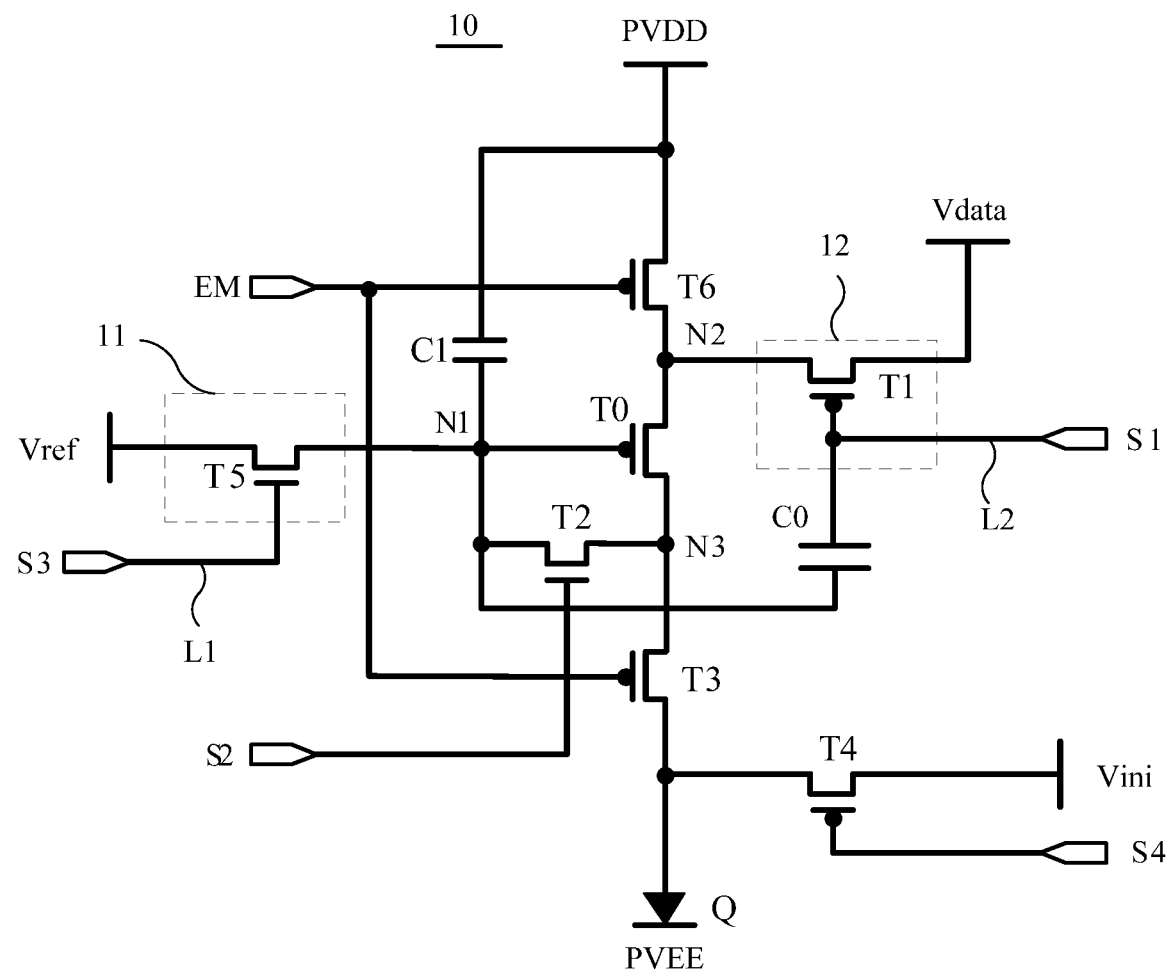
FIG. 5 illustrates another circuit structure of a pixel circuit in an exemplary display panel consistent with various disclosed embodiments in the present disclosure.

In another embodiment illustrated in FIG. 5 showing a structural diagram of another pixel circuit, the pixel circuit may include a reset transistor T5, and the reset transistor T5 may be connected between the gate Gm of the driving transistor T0 and a reset signal terminal. The reset signal terminal may be used to input reference voltage Vref. Different from the embodiment shown in FIG. 1, in the present embodiment shown in FIG. 5, the first transistor 11 may be used as the reset transistor T5, which is used to reset the voltage of the first node N1.

As shown in FIG. 1, FIG. 4, and FIG. 5, the pixel circuit may include a data writing transistor T1. The data writing transistor T1 may be connected between the source of the driving transistor T0 and a data signal terminal. The data signal terminal may be used to input the data signal Vdata. In one embodiment, the second transistor 12 may be used as the data writing transistor T1. Correspondingly, data can be written through the second transistor 12.

The second transistor 12 may be set as the data writing transistor T1, and the second signal line L2 may use the control signal S1 to control the data signal Vdata to be written to the transistor T1. At this time, in the data writing stage, the data writing transistor T1 may be turned on, and the compensation transistor T2 may be turned on. Since the data writing transistor T1 may be a PMOS transistor, the time when the data writing transistor T1 is turned on may be at a falling edge of a pulse of the control signal S1. Since the transistor T2 may be an NMOS transistor, the time when the compensation transistor T2 is turned on may be at the rising edge of the control signal S2. When the data writing phase ends, the control signal S2 may be at the falling edge of the pulse and the control signal S1 may be at the rising edge of the pulse. Since the compensation transistor T2 is connected to the gate $G_{T0}$ of the driving transistor T0, the turning off of the compensation transistor T2 will affect the gate voltage of the driving transistor T0. At this time, the driving transistor T0 may complete writing the data signal Vdata, and the stability of its gate voltage may be very important. In the present embodiment, the first capacitor C0 may be connected between the gate $G_{T0}$ of the driving transistor T0 and the gate of the data writing transistor T1, to eliminate fluctuation of the gate potential of the driving transistor T0 induced by falling of the pulse of the control signal S1 written to the gate of the data writing transistor T1.

Figure 6:
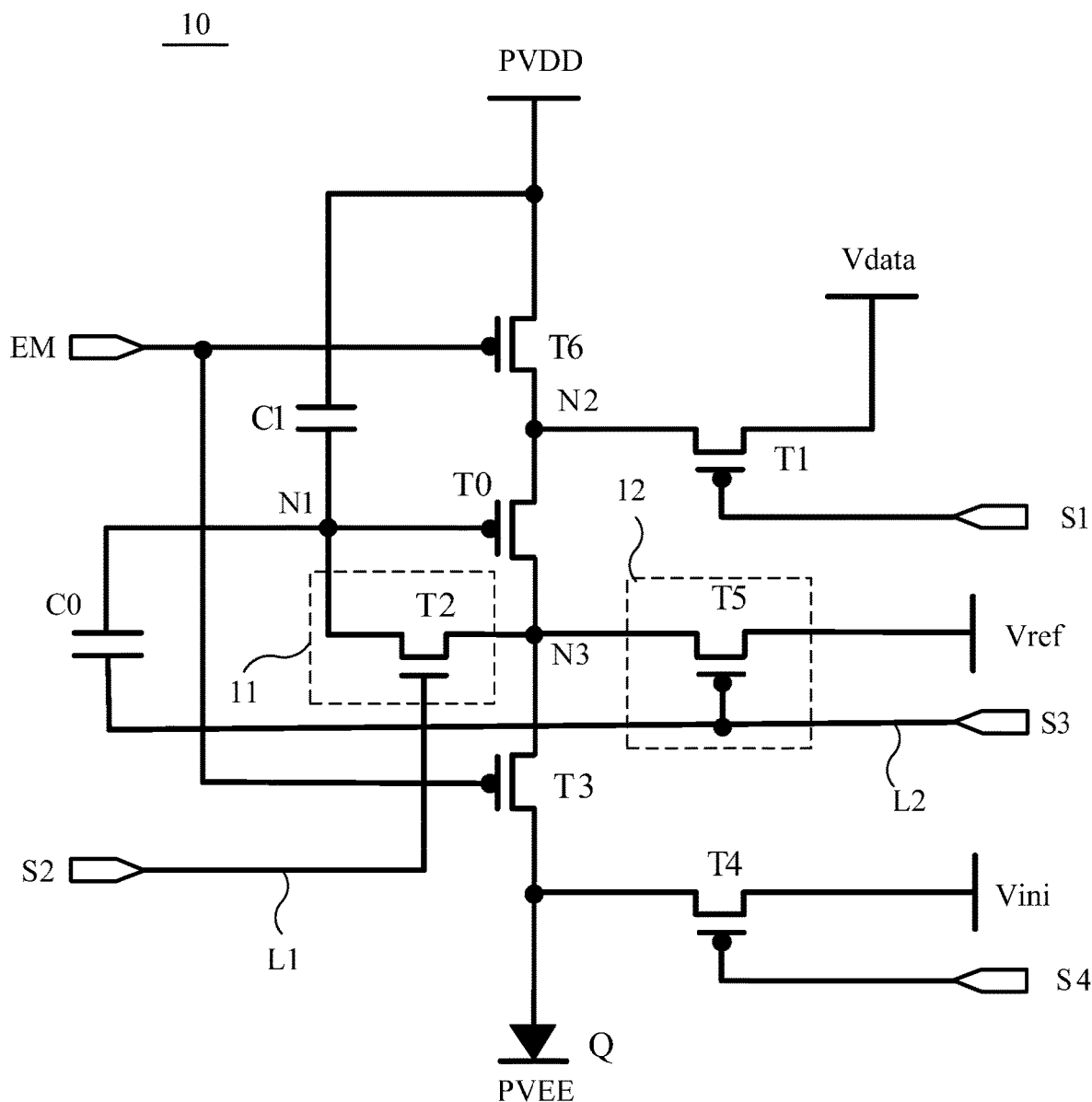
FIG. 6 illustrates another circuit structure of a pixel circuit in an exemplary display panel consistent with various disclosed embodiments in the present disclosure.

In another embodiment shown in FIG. 6, the pixel circuit may include a compensation transistor T2, and the compensation transistor T2 may be connected between the gate $G_{T0}$ of the driving transistor T0 and the drain of the driving transistor T0. The pixel circuit may includes a reset transistor T5. The reset transistor T5 may be connected between the drain of the driving transistor T0 and the reset signal terminal. The reset signal terminal may be used to input the reference voltage Vref as a reset signal. The working process of the pixel circuit may include a reset phase and a bias adjustment phase. In the reset phase, the reset transistor T5 and the compensation transistor T2 may be turned on, and the reset signal terminal may provide a reset signal to the gate $G_{T0}$ of the driving transistor T0. In the bias adjustment phase, the reset transistor T5 may be turned on, the compensation transistor T2 may be turned off, and the reset signal terminal may provide a bias adjustment signal to the drain of the driving transistor T0 for adjusting the bias state of the driving transistor T0. The second transistor 12 may be used as the reset transistor T5.

In the embodiment shown in FIG. 6, the second transistor 12 may be used as a reset transistor T5 integrating the reset function and the bias adjustment function. The second signal line L2 may control the state of the reset transistor T5. Taking the pixel circuit in FIG. 6 where the driving transistor is a PMOS transistor as an example, when the light-emitting element Q emits light, since the gate of the driving transistor T0 is input with the data signal Vdata, the driving transistor T0 may work in an unsaturated state. It may exist that when the driving transistor T0 starts, its gate potential is larger than the drain potential, which will cause a reverse electric field to be established between the gate and the drain, causing the Id-Vg curve of the driving transistor T0 to shift. Therefore, the threshold voltage of the driving transistor T0 may be shifted, and the data signal input to the driving transistor may be no longer stable, thereby affecting the size of the driving current and the brightness of the light-emitting element. In the present embodiment, by setting the bias adjustment stage and adjusting the drain potential of the driving transistor T0 through the bias adjustment signal, the drain potential may be made larger than the gate potential, and the above-mentioned reverse electric field may be cancelled out, thereby avoiding the shift of the threshold voltage of the driving transistor. In the bias adjustment stage, the reset transistor T5 may be turned on, and the compensation transistor T2 may be turned off. When the reset transistor T5 is a PMOS transistor, at the beginning, the control signal S3 on the second signal line L2 may be a low-level signal, and the input bias adjustment signal Vref may be a high-level signal. By using the first capacitor C0 to connect the gate of the driving transistor T0 to the second signal line L2, the low-level signal on the second signal line L2 may pull down the gate potential of the driving transistor T0 and the drain potential of the driving transistor T0 may be raised by the high-level signal Vref, which is more conducive to realizing the adjustment of the electric field between the gate potential and the drain potential of the driving transistor and to the adjustment of the threshold voltage of the driving transistor.

For description purposes only, the embodiments where the driving transistor T0 is a PMOS transistor are used as examples to illustrate the present disclosure, and should not limit the scope of the present disclosure. In some other embodiments, the driving transistor T0 may be an NMOS transistor. Also, the driving transistor T0 may be an oxide semiconductor transistor or a low-temperature polysilicon transistor.

Further, it should be noted that, as shown in FIG. 2, the first transistor may have a top gate and a bottom gate located at two sides of the active layer in a direction perpendicular to the surface of the display panel. Especially, when the first transistor is an oxide semiconductor transistor, there may be two signal lines respectively providing signals for the top gate and bottom gate of the first transistor. In this case, the first signal line may be any one of a top gate signal line or a bottom gate signal line, which is included in the scope of the present disclosure.

Figure 7:
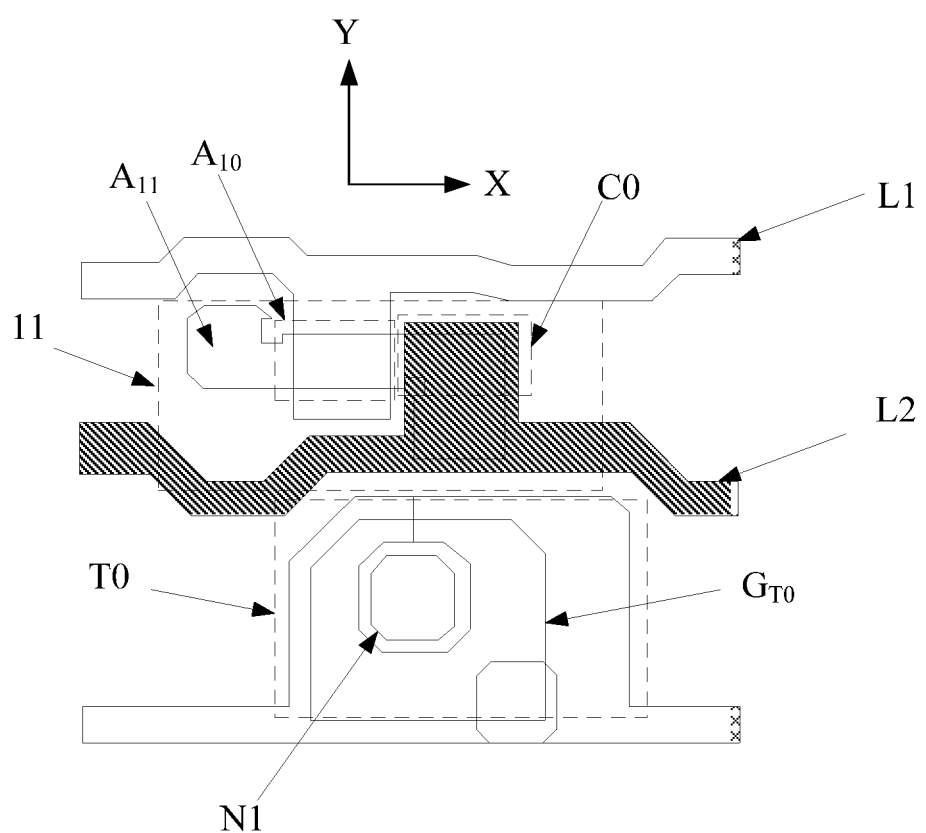
FIG. 7 illustrates another circuit layout of a pixel circuit in an exemplary display panel consistent with various disclosed embodiments in the present disclosure.

In another embodiment shown in FIG. 7 illustrating another display panel circuit layout, when being orthographically project on the plane parallel to the surface of the display panel, the second signal line L2 may be located between the gate $G_{T0}$ of the driving transistor T0 and the first signal line L1, and the first capacitor C0 may be located between the gate $G_{T0}$ of the driving transistor T0 and the first signal line L1. In the present embodiment, the gate $G_{T0}$ of the driving transistor T0 may be connected to the first node N1, the second signal line L2 may be located between the first node N1 and the first signal line L1, and the first capacitor C0 may be also located between the first node N1 and the first signal line L1. When the second signal line L2 and the first capacitor C0 are both located between the first signal line L1 and the first node N1, an area between the first signal line L1 and the first node N1 may be used to accommodate the second signal line L2 and the first capacitor C0, to ensure that the second signal line L2 can extend a small distance to form the first capacitor C0. The line extension and the parasitic capacitance may be reduced and the resolution (PPI) of the display panel may not be affected.

In the embodiment shown in FIG. 7, when being orthographically project on the plane parallel to the surface of the display panel, the first capacitor C0 and the channel region $A_{10}$ of the first transistor 11 may be both located between the first signal line L1 and the second signal line L2. Further, the gate $G_{T0}$ of the driving transistor T0, the second signal line L2 and the first signal line L1 may be arranged along a first direction Y; and the first capacitor C0 and the channel region A10 of the first transistor 11 may be arranged along a second direction X. The first direction Y and the second direction X may be perpendicular to each other. In the present embodiment, the signal lines may be arranged in the first direction Y, and the first capacitor C0 and the first transistor 11 may be arranged in the second direction X, to make full use of the space in the first direction Y and the second direction X. The area of the pixel circuit may be reduced and the resolution (PPI) of the display panel may be improved.

For the pixel circuit shown in FIG. 4, to reduce the space occupied by lines, the method shown in FIG. 7 may be adopted. A signal line for inputting the reference voltage Vref to the transistor T5 may be configured as a third signal line L3, and a signal line for inputting the control signal S3 to the transistor T5 may be configured as a fourth signal line L4, and a signal line for inputting the control signal EM to the transistor T6 may be configured as a fifth signal line L5. The third signal line L3, the fourth signal line L4, the third signal line L3, and the first signal line L1, the second signal line L2, the driving transistor T0, and the fifth signal line L5 may be arranged sequentially in the first direction Y. Or, the fourth signal line L4, the third signal line L3, the first signal line L1, the second signal line L2, the driving transistor T0, and the fifth signal line L5 may be sequentially arranged in the first direction Y.

As shown in FIG. 3 and FIG. 7, the first electrode plate of the first capacitor C0 and the active layer Au of the first transistor 11 may be located in the same layer, and the gate $G_{T0}$ of the driving transistor T0 may be connected to the first capacitor C0 through a via hole. Correspondingly, the first electrode plate of the first capacitor C0 may be formed at the same time when the active layer $A_{11}$ of the first transistor 11 is formed, and there may be no need to add a separate conductive layer to make the first electrode plate of the first capacitor C0. The second plate of the first capacitor C0 and the gate $G_{T0}$ of the driving transistor T0 may be located in the same layer. Correspondingly, the second electrode plate of the first capacitor C0 may be formed at the same time as the gate $G_{T0}$ of the driving transistor T0, and there may be no need to add a separate conductive layer to make the second electrode plate of the first capacitor C0.

Figure 8:
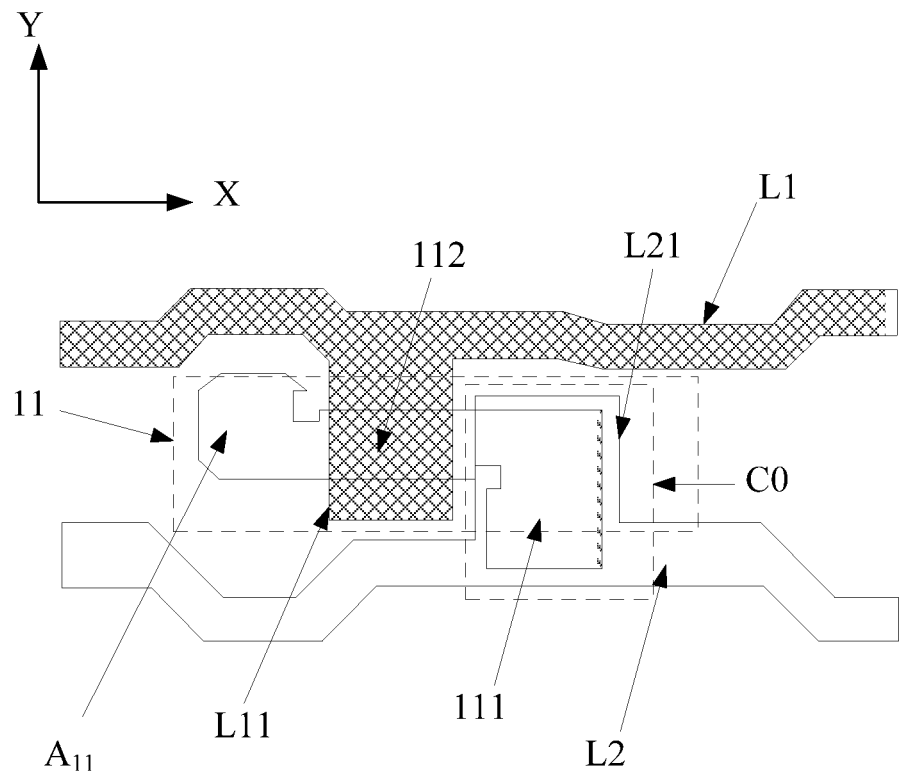
FIG. 8 is a locally enlarged view of FIG. 7, in an exemplary display panel consistent with various disclosed embodiments in the present disclosure.

As shown in FIG. 8 which is a partial enlarged view of FIG. 7, the active layer Au of the first transistor 11 may include a first region 111 and a second region 112. The first region 111 may extend along the first direction Y, and the second region 112 may extend along the second direction X. The first region 111 and the second signal line L2 may overlap each other to form the first capacitor C0, and the second region 112 and the first signal line L1 may overlap each other to form the channel region $A_{10}$ of the first transistor 11.

In the present embodiment, the first capacitor C0 may be formed by the first region 111 of the active layer $A_{11}$, and the channel region $A_{10}$ may be formed by the second region 112 of the active layer $A_{11}$. Correspondingly, the active layer Au of the first transistor 11 may be used for forming the channel region $A_{10}$ and the first capacitor C0 at the same time. The structure may be fully simplified, to save the area of the circuit layout, and t the resolution (PPI) of the display panel may be improved. Further, the first region 111 and the second region 112 may extend in the first direction Y and the second direction X, respectively, such that the channel region $A_{10}$ and the first capacitor C0 may be staggered in the second direction X, making full use of the space in the second direction X. The space in the first direction Y may be reduced, such that the layout space of the pixel circuit may be compact to improve the resolution (PPI) of the display panel.

As shown in FIG. 2, FIG. 7 and FIG. 8, the first signal line L1 and the second signal line L2 may extend along the second direction X. The first signal line L1 may include a first protrusion L11 extending along the first direction Y. The first protrusion L11 may overlap the active layer Au of the first transistor 11. The second signal line L2 may include a second protrusion L21 extending along the first direction Y, and the second protrusion L21 may overlap the active layer $A_{11}$ of the first transistor 11. The first protrusion L11 and the second protrusion L21 may not overlap each other.

In the present embodiment, the active layer Au of the first transistor 11 may be configured to extend along the second direction, and the first signal line L1 may be provided with the first protrusion L11. The first protrusion L11 may overlap the active layer Au to form the channel region $A_{10}$. The second signal line L2 may be provided with the second protrusion L21, and the second protrusion L21 may overlap the active layer $A_{11}$ of the first transistor 11 to form the first capacitor C0. The first protrusion L11 and the second protrusion L21 may not overlap each other, and may be staggered in the second direction X. Correspondingly, there may be no overlap between the channel region $A_{10}$ and the first capacitor C0, avoiding the mutual influence between the channel region $A_{10}$ and the first capacitor C0.

As shown in FIG. 2, FIG. 3, FIG. 7 and FIG. 8, in the active layer Au of the first transistor 11, the first region 111 may be located at a side close to the gate $G_{T0}$ of the driving transistor T0, and the second region 112 may be located at another side away from the gate $G_{T0}$ of the driving transistor T0. The gate $G_{T0}$ of the driving transistor T0 may be connected to the first node N1. In the present embodiment, the first region 111 may be close to the first node N1, and the second region 112 may be far away from the first node N1. Correspondingly, the first capacitor C0 formed in the first region 111 can be made closer to the gate $G_{T0}$ of the driving transistor T0.

On the one hand, the second signal line L2 may only need to extend a small length in the first direction Y to form the second protrusion L21 which is used to form the first capacitor C0 with the first region 111, thereby preventing the second signal line L2 of the driving transistor T0 from extending a long area in the first direction Y and simplifying the structure.

On the other hand, the source $S_{11}$ of the first transistor 11 may be connected to the first node N1, and the drain $D_{11}$ of the first transistor 11 may be far away from the first node N1. Correspondingly, the distance between the channel region $A_{10}$ of the first transistor 11 and the source $S_{11}$ may be larger than the distance between the channel region $A_{10}$ of the first transistor 11 and the drain $D_{11}$.

The gate $G_{T0}$ of the driving transistor T0 may determine the magnitude of the driving current. Therefore, the gate potential of the driving transistor T0 may need to maintain good stability. Especially, when the driving transistor T0 is turned off, the leakage current may need to be small enough. In the present disclosure, the distance between the channel region $A_{10}$ of the first transistor 11 and the source $S_{11}$ may be larger than the distance between the channel region $A_{10}$ of the first transistor 11 and the drain $D_{11}$. Correspondingly, the path between the channel region $A_{10}$ and the source S11 in the first transistor 11 may be longer and may have a relatively large resistance. The leakage current may be difficult to happen, ensuring the stability of the voltage of the gate $G_{T0}$ of the driving transistor T0.

Figure 9:
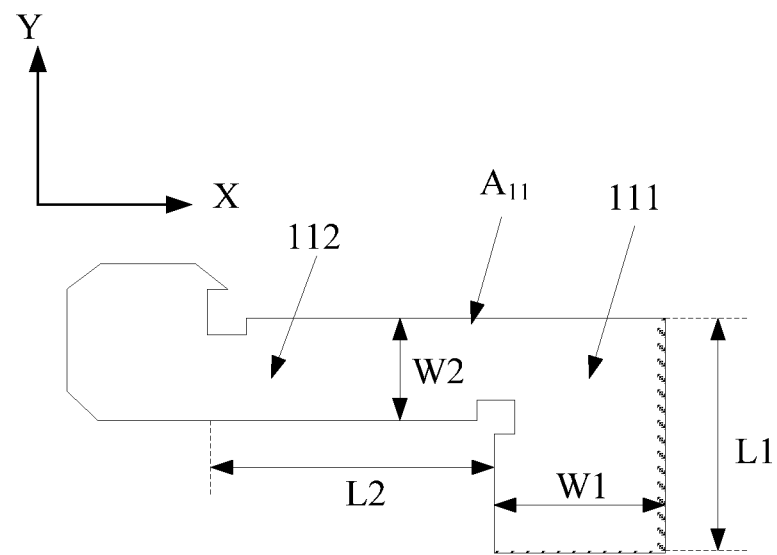
FIG. 9 illustrates a structure of an active layer of a first transistor in an exemplary display panel consistent with various disclosed embodiments in the present disclosure.

FIG. 9 shows a schematic structural diagram of an active layer of a first transistor provided by one embodiment of the present embodiment. As shown in FIG. 2 and FIGS. 7-9, a width of the first region along the second direction X may be W1, and a width of the second region along the first direction Y may be W2, where W1>W2. Since the first signal line L1 and the second signal line L2 may both extend along the second direction X, when the distance between the first signal line L1 and the second signal line L2 is constant, there may be enough space in the second direction X such that the first region 111 could have a larger width W1 in the second direction X. The first region 111 may be used to form the first capacitor C0, and the first region 111 with a larger width W1 in the second direction X may make the first capacitor C0 have a larger capacitance value. Correspondingly, the potential of the first node N1 can be better adjusted by the first capacitor C0.

The second region 112 may be used to form the channel region $A_{10}$ of the first transistor 11. The channel width and length of the channel region $A_{10}$ may have a large impact on the performance of the first transistor 11. Since the first transistor 11 is not a driving transistor but a switching transistor, the performance requirements may be met by a smaller channel width and length. Therefore, in the present embodiment, W1>W2 is set.

As shown in FIG. 9, a length of the first region 111 along the first direction Y may be L1, and a length of the second region 112 along the second direction X may be L2, where L1<L2. On the one hand, when the length L1 of the first region 111 is small and the length L2 of the second region 112 is large, by increasing the width W1 of the first region 111, a larger first capacitor C0 may be also be formed. On the other hand, the length of the second region 112 may be relatively large, ensuring that the first transistor 111 has a certain large channel size to improve its switching performance.

Figure 10:
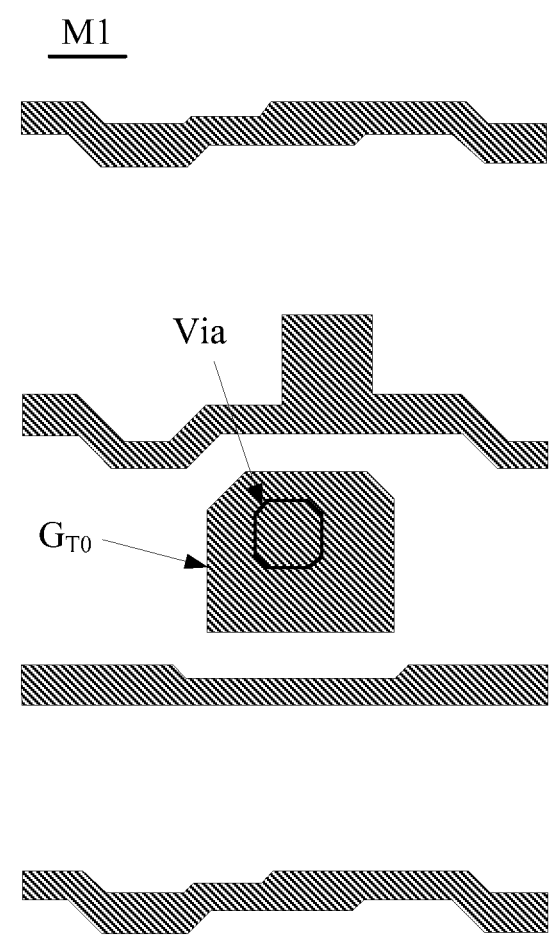
FIG. 10 illustrates a structure of a first metal layer in an exemplary display panel consistent with various disclosed embodiments in the present disclosure.
Figure 11:
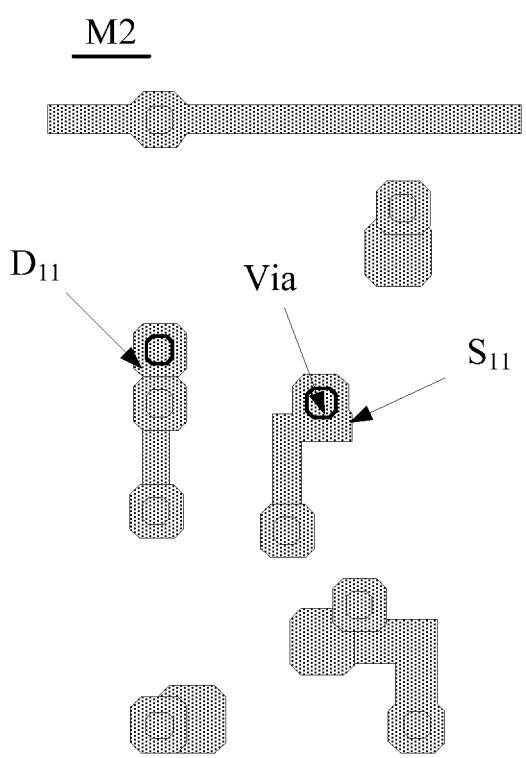
FIG. 11 illustrates a structure of a second metal layer in an exemplary display panel consistent with various disclosed embodiments in the present disclosure.

FIG. 10 is a schematic structural diagram of a first metal layer provided by an embodiment of the present disclosure, and FIG. 11 is a schematic structural diagram of a second metal layer provided by an embodiment of the present disclosure. As shown in FIG. 2, FIG. 3, FIG. 10 and FIG. 11, the display panel may includes the first metal layer M1 and the second metal layer M2. The gate $G_{T0}$ of the driving transistor T0 may be located in the first metal layer M1, and the source $S_{11}$ of the first transistor 11 and/or drain $D_{11}$ may be located in the second metal layer M2. The gate $G_{T0}$ of the driving transistor T0 may be connected to the source $S_{11}$ of the first transistor 11 through a via hole Via, and the source $S_{11}$ of the first transistor 11 may be connected to the first electrode plate of the first capacitor C0 through the via hole Via. In the present embodiment, the gate $G_{T0}$ of the driving transistor T0 may be first punched from the first metal layer M1 to the second metal layer M2 to form the source $S_{11}$ of the first transistor 11, and then punched to the first electrode plate, such that the first metal layer M1 may be multiplexed to form the first capacitor C0 with the active layer $A_{11}$.

Figure 12:
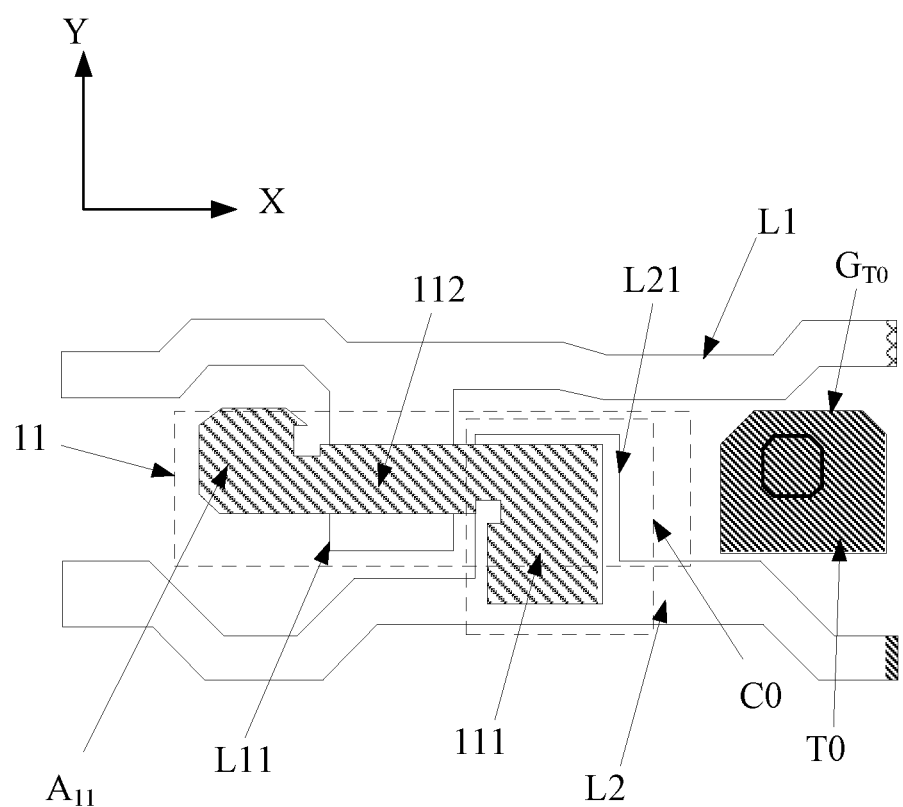
FIG. 12 illustrates a layout of signal lines and transistors in an exemplary display panel consistent with various disclosed embodiments in the present disclosure.

FIG. 12 is a schematic diagram of the layout structure of signal lines and transistors in a display panel provided by an embodiment of the present disclosure. As shown in FIG. 12, in one embodiment, when being orthographically project on the plane parallel to the surface of the display panel, the first signal line L1 and the second signal line L2 may be respectively located at two sides of the gate $G_{T0}$ of the driving transistor T0. The first signal line L1, the gate $G_{T0}$ of the driving transistor T0, and the second signal line L2 may be arranged along the first direction Y. The first signal line L1 and the second signal line L2 may extend along the second direction X, and the first direction Y and the second direction X may be perpendicular to each other. As mentioned above, by arranging the first signal line L1 and the second signal line L2 at two sides of the driving transistor T0 respectively, the distance between the second signal line L2 and the first node N1 may be reduced, and the parasitic capacitance induced by that the first signal line L1 and the second signal line L2 are located at the same side of the driving transistor T0 and the first signal line L1 is close to the first node N1 may be avoided.

In the embodiment shown in FIG. 12, when being orthographically project on the plane parallel to the surface of the display panel, the first capacitor C0 and the channel region $A_{10}$ of the first transistor 11 may be both located between the first signal line L1 and the second signal line L2. Correspondingly, the first capacitor C0, the first transistor 11, and the driving transistor T0 may be all arranged between the first signal line L1 and the second signal line L2, and the space between the two signal lines can be fully utilized to set up the first capacitor C0, the first transistor 11 and the driving transistor T0, improving the resolution (PPI) of the display panel. Further, only a short protrusion in the first direction Y in the second signal line L2 may be needed to form one electrode plate of the first capacitor C0, which can avoid a longer protrusion in the second signal line L2. Only a short protrusion L2 may be needed to form the required first capacitor C0. Further, the channel region $A_{10}$ of the first transistor 11 may be located between the first signal line L1 and the second signal line L2, and the source or drain of the first transistor 11 may be connected to the gate $G_{T0}$ of the driving transistor T0. The space for the transistor 11 may be saved and the layout may be simplified.

As shown in FIG. 12, the first signal line L1 may include a first protrusion L11 extending along the first direction Y, and the first protrusion L11 may overlap the active layer of the first transistor. The second signal line L2 may include second protrusion L21 extending in the first direction Y, and the second protrusion L21 may overlap the first electrode plate of the first capacitor C0. When being orthographically project on the plane parallel to the surface of the display panel, the first protrusion L11 and the second protruding portion L21 may be both located between the first signal line L21 and the second signal line L21. Correspondingly, the first signal line L1 may only need to be provided with a short first protrusion L11 extending in the first direction Y, such that the first protrusion L11 could overlap a part of the active layer $A_{11}$ to form the channel of the first transistor 11, and the second signal line L2 may only need to be provided with a short second protrusion L21 extending in the first direction Y, such that the second protrusion L21 could overlap another part of the active layer $A_{11}$ to form the first capacitor C0. The panel space may be saved and the resolution (PPI) of the display panel may be improved.

Figure 13:
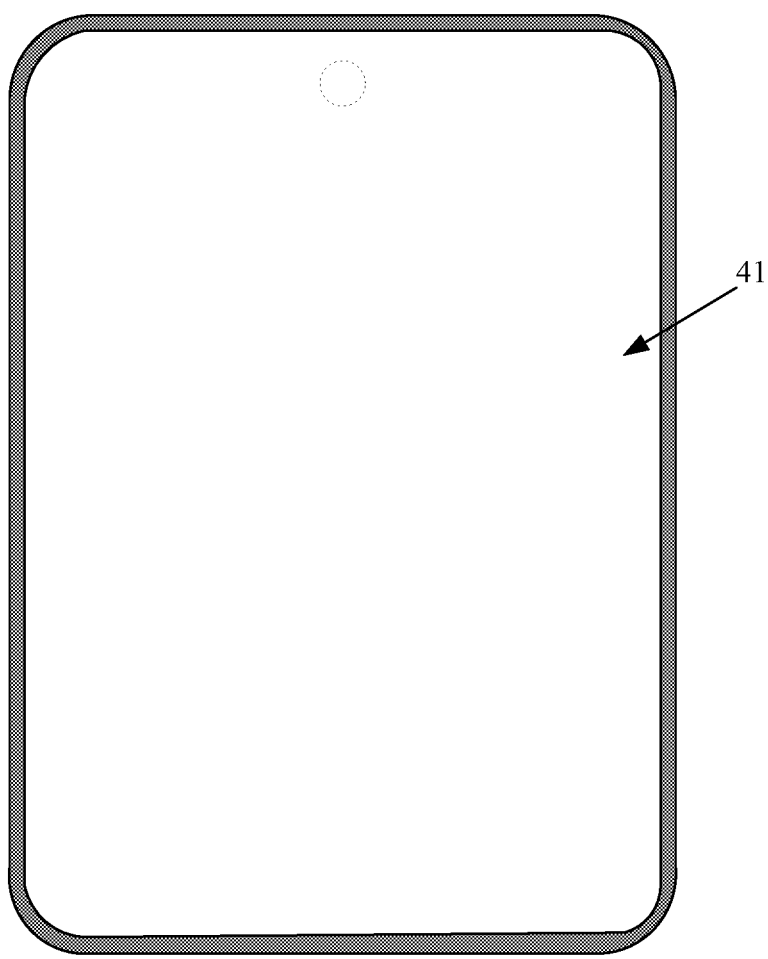
FIG. 13 illustrates an exemplary display device consistent with various disclosed embodiments in the present disclosure.

The present disclosure also provides a display device. As shown in FIG. 13, the display device may include a display panel 41 provided by various embodiments of the present disclosure.

In various embodiments, the display device may include, but are not limited to, electronic devices with display functions such as mobile phones, tablet computers, notebook computers, or smart wearable devices. Since the display device may include a display panel 41 provided by various embodiments of the present disclosure, the problem of node voltage instability may be solved, the dark state voltage may be reduced, the display driving power consumption may be small. Further, by using the unique first capacitor layout method in the display panel, the resolution (PPI) of the display panel may not be affected.

In the present disclosure, the first capacitor may be used to adjust the stability of the voltage of a node connected to the gate of the driving transistor. The display quality of the display panel may be improved. Further, when being orthographically projected on a plane parallel to a surface of the display panel, the second signal line is located between the gate of the driving transistor and the first signal line, or the first signal line and the second signal line are located at two sides of the gate of the driving transistor respectively. Correspondingly, the distance between the second signal line and the node connected to the gate of the driving transistor may be smaller, such that it may be easier to lay out the first capacitor. The parasitic capacitance problem caused by setting the first capacitor may be avoided, and the layout of the pixel circuit may be more compact. The pixel circuit may not occupy a large area and the resolution (PPI) of the display panel may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
a pixel circuit and a light-emitting element, wherein:
the pixel circuit includes a driving transistor for providing a driving current to the light-emitting element, a first transistor, and a second transistor;
a source or drain of the first transistor is connected to a gate of the driving transistor; and
a source or drain of the second transistor is connected to a source or drain of the driving transistor;
a first signal line connected to a gate of the first transistor for providing a control signal for the first transistor;
a second signal line connected to a gate of the second transistor for providing a control signal for the second transistor; and
a first capacitor including a first electrode plate connected to the gate of the driving transistor and a second electrode plate connected to the second signal line,
wherein:
when being orthographically projected on a plane parallel to a light-emitting surface of the display panel, the second signal line is located between the gate of the driving transistor and the first signal line, or the first signal line and the second signal line are located at two sides of the gate of the driving transistor respectively; and
an active layer of the first transistor includes a first region and a second region, the first region extends in the first direction, and the second region extends in the second direction.

2. The display panel according to claim 1, wherein:
the first transistor is an NMOS transistor;
an active layer of the first transistor is made of a material including an oxide semiconductor;
the second transistor is a PMOS transistor; and
an active layer of the second transistor is made of a material including silicon.

3. The display panel according to claim 1, wherein:
the pixel circuit includes a compensation transistor connected between the gate of the driving transistor and the drain of the driving transistor; and
the first transistor is used as the compensation transistor.

4. The display panel according to claim 1, wherein:
the pixel circuit includes a reset transistor connected between the gate of the driving transistor and a reset signal terminal; and
the first transistor is used as the reset transistor.

5. The display panel according to claim 1, wherein:
the pixel circuit includes a data writing transistor connected between the source of the driving transistor and a data writing terminal; and
the second transistor is used as the data writing transistor.

6. The display panel according to claim 1, wherein:
the pixel circuit includes: a compensation transistor connected between the gate of the driving transistor and the drain of the driving transistor, and a reset transistor connected between the gate of the driving transistor and a reset signal terminal;

during operation of the pixel circuit, a reset phase and a bias adjustment phase are performed;
in the reset phase, the reset transistor and the compensation transistor are turned on, and the reset signal terminal provides a reset signal to the gate of the driving transistor;
in the bias adjustment phase, the reset transistor is turned on, the compensation transistor is turned off, and the reset signal terminal provides a bias adjustment signal to the drain of the drive transistor for adjusting a bias state of the drive transistor; and
the second transistor is used as the reset transistor.

7. The display panel according to claim 1, wherein:
when being orthographically project on the plane parallel to the light-emitting surface of the display panel, both the second signal line and the first capacitor are located between the gate of the driving transistor and the first signal line.

8. The display panel according to claim 7, wherein:
when being orthographically project on the plane parallel to the light-emitting surface of the display panel, the first capacitor and a channel region of the first transistor are located between the first signal line and the second signal line;
the gate of the driving transistor, the second signal line, and the first signal line are arranged along a first direction;
the first capacitor and the channel region of the first transistor are arranged along a second direction; and
the first direction and the second direction are perpendicular to each other.

9. The display panel according to claim 8, wherein:
the first electrode plate of the first capacitor is disposed in a layer same as the active layer of the first transistor; and
the gate of the driving transistor is connected to the first electrode plate of the first capacitor through a via hole.

10. The display panel according to claim 9, wherein:
the first region and the second signal line overlap each other to form the first capacitor; and
the second region and the first signal line overlap each other to form the channel region of the first transistor.

11. The display panel according to claim 10, wherein:
the first signal line and the second signal line extend in the second direction;
the first signal line includes a first protrusion extending in the first direction and overlapping with the active layer of the first transistor;
the second signal line includes a second protrusion extending along the first direction and overlapping with the active layer of the first transistor; and
the first protrusion and the second protrusion do not overlap with each other.

12. The display panel according to claim 10, wherein:
in the active layer of the first transistor, the first region is located at a side close to the gate of the driving transistor, and the second region is located at another side far from the gate of the driving transistor.

13. The display panel according to claim 10, wherein:
a width of the first region along the second direction is W1, and a width of the second region along the first direction is W2, wherein W1>W2.

14. The display panel according to claim 10, wherein:
a length of the first region along the first direction is L1, and a length of the second region along the second direction is L2, wherein L1<L2.

15. The display panel according to claim 10, wherein:
the display panel includes a first metal layer and a second metal layer;
the gate of the driving transistor is located in the first metal layer, and the source and/or drain of the first transistor is located in the second metal layer;
the gate of the driving transistor is connected to the source of the first transistor through a via hole, and the source of the first transistor is connected to the first electrode plate of the first capacitor through a via hole.

16. The display panel according to claim 1, wherein:
when being orthographically project on the plane parallel to the light-emitting surface of the display panel, the first signal line and the second signal line are respectively located at two sides of the gate of the driving transistor;
the first signal line, the gate of the driving transistor, and the second signal line are arranged along a first direction;
the first signal line and the second signal line extend in a second direction; and
the first direction and the second direction are perpendicular to each other.

17. The display panel according to claim 16, wherein:
when being orthographically project on the plane parallel to the light-emitting surface of the display panel, the first capacitor and a channel region of the first transistor are located between the first signal line and the second signal line.

18. The display panel according to claim 16, wherein:
the first signal line includes a first protrusion extending in the first direction and overlapping the active layer of the first transistor;
the second signal line includes a second protrusion extending along the first direction and overlapping the first electrode plate of the first capacitor; and
when being orthographically projected on the plane parallel to the light-emitting surface of the display panel, the first protrusion and the second protrusion are both located between the first signal line and the second signal line.

19. A display device, comprising a display panel, wherein:
the display panel includes:
a pixel circuit and a light-emitting element, wherein:
the pixel circuit includes a driving transistor for providing a driving current to the light-emitting element, a first transistor, and a second transistor;
a source or drain of the first transistor is connected to a gate of the driving transistor; and
a source or drain of the second transistor is connected to a source or drain of the driving transistor;
a first signal line connected to a gate of the first transistor for providing a control signal for the first transistor;
a second signal line connected to a gate of the second transistor for providing a control signal for the second transistor; and
a first capacitor including a first electrode plate connected to the gate of the driving transistor and a second electrode plate connected to the second signal line,
wherein:
when being orthographically projected on a plane parallel to a light-emitting surface of the display panel, the second signal line is located between the gate of the driving transistor and the first signal line, or the first signal line and the second signal line are located at two sides of the gate of the driving transistor respectively; and an active layer of the first transistor includes a first region and a second region, the first region extends in the first direction, and the second region extends in the second direction.

\* \* \* \* \*